United States Patent

[11] 3,569,797

[72] Inventor George Simmons
Morganville, N.J.

[21] Appl. No. 806,643
[22] Filed Mar. 12, 1969
[45] Patented Mar. 9, 1971
[73] Assignee The Bendix Corporation

[54] SEMICONDUCTOR DEVICE WITH PREASSEMBLED MOUNTING
9 Claims, 7 Drawing Figs.

[52] U.S. Cl. .......... 317/234
[51] Int. Cl. .......... H01l 1/02, H01l 5/02
[50] Field of Search .......... 317/234.4, 234.1, 234/1.5, 234/1.51, 234.2, 234.3, 234/3.1, 234.4, (all) 234.5, 234.6 (Foreign also)

[56] References Cited

UNITED STATES PATENTS

| | | | |
|---|---|---|---|
| 3,047,781 | 7/1962 | Eannarino | 317/234 |
| 3,060,553 | 10/1962 | Kelley | 29/25.3 |
| 3,153,275 | 10/1964 | Ackerman | 29/25.3 |
| 3,390,450 | 7/1968 | Checki et al. | 29/589 |
| 3,179,855 | 4/1965 | Brombaugh | 317/234 |
| 3,249,827 | 5/1966 | Benda et al. | 317/234 |
| 3,348,105 | 10/1967 | Doyle | 317/234 |
| 3,427,510 | 2/1969 | Schwarz et al. | 317/234 |
| 3,423,516 | 1/1969 | Segerson | 317/234 |
| 3,431,092 | 3/1969 | Lehner | 317/234 |

*Primary Examiner*—John W. Huckert
*Attorneys*—Plante, Arens, Hartz & O'Brien and James M. Nickels

ABSTRACT: A semiconductor device in which the active element is isolated from the housing by a thermally conducting material and having the leads formed to provide spring contact with the active element and also serve as an inserting and positioning fixture.

PATENTED MAR 9 1971 3,569,797

INVENTOR.
GEORGE SIMMONS
BY

ATTORNEY

SEMICONDUCTOR DEVICE WITH PREASSEMBLED MOUNTING

BACKGROUND OF THE INVENTION

1. Field of the Invention

The invention relates to the field of fabricating semiconductor devices and more particularly to means and method for mounting semiconductor devices in housing.

2. Description of the Prior Art

Heretofore in may many types of transistors, the active element was mounted on a relatively massive header which formed a part of the envelope. The header was made of a metal having good heat-conducting properties and also served as the electrical connection for the collector. With the envelope forming one connection for the device, it was necessary to provide an insulator between the envelope and the chassis or panel upon which it was mounted. This reduced the thermal efficiency of the device. Further, it was necessary to make connections to the emitter and base which involved using very fine wire from the element to the post extending into the housing through glass to metal seals. Such operations are tedious and time consuming and lacking uniformity which resulted in low yields of quality devices.

The present invention provides a device that is electrically isolated from the envelope but has good thermal conductivity therewith. Also the leads are such that they serve as a holding fixture for the active device and eliminate the need for the post used in prior devices.

SUMMARY OF THE INVENTION

A semiconductor assembly utilizing a housing, having an opening at one end thereof, filled with a thermal conducting epoxy filler into which an active element is positioned by means of the conductors attached thereto. The conductors are formed to coact with the housing to position the active element into close proximity with one side of the housing for good thermal conductivity but being isolated electrically there from.

DESCRIPTION OF THE PREFERRED EMBODIMENT

Figures 1, 2, 3, 4, 5, 6, 7:
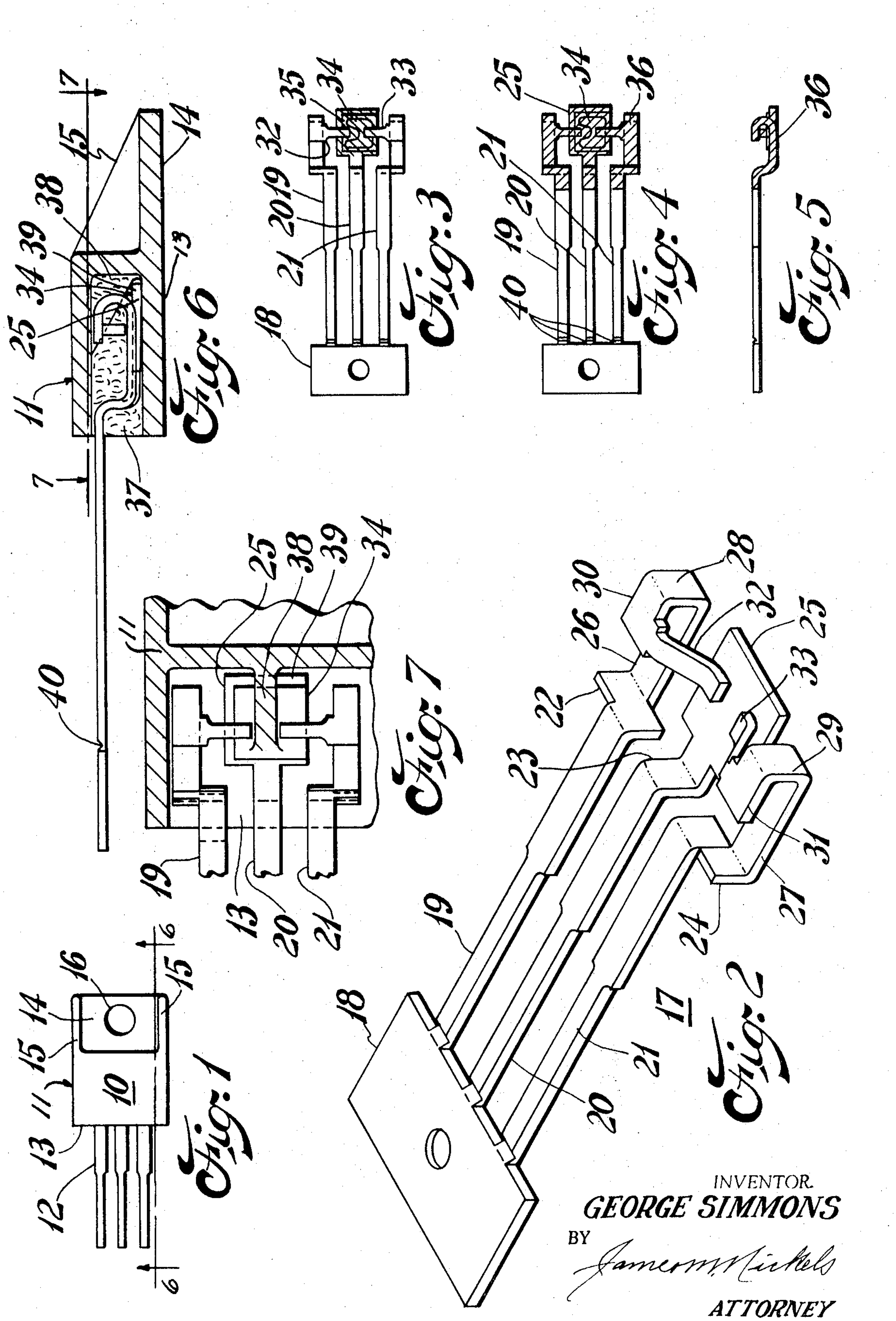
FIG. 1 is a plane view of a semiconductor device embodying the invention.
FIG. 2 is a perspective view of a lead frame embodying the invention.
FIG. 3 is a plane view of the frame of FIG. 2 with a semiconductor element mounted thereon.
FIG. 4 is a plane view of the frame of FIG. 2 illustrating a completed mount assembly.
FIG. 5 is a side view of the assembly of FIG. 4.
FIG. 6 is a cross section view of the assembled device taken along the lines 6–6 of FIG. 1.
FIG. 7 is a cross section view of the assembled device taken along the lines 7–7 of FIG. 6.

Reference is now made to FIG. 1 of the drawing wherein a semiconductor device is assembly device assembly is indicated generally by the numeral 10. The device assembly 10 includes a housing or platform 11 in which a semiconductor element 12 is positioned. The housing 11 has a cavity section 13 and a mounting section 14. Ribs 15 are provided on the mounting section 14 for strength. A hole 16 is provided to permit the mounting on a chassis or other surface by a mounting screw (not shown). The housing 11 is a of a material having good heat transfer characteristics such as zinc alloy, aluminum alloy or others and may be a diecasting.

Reference is now made to FIG. 2 in which a lead frame, indicated generally by the numeral 17, used in the device assembly 10 is a illustrated. The lead frame 17 is a one piece stamping of a metal having good electrical conductivity, for example, copper. The lead frame 17 includes a tab 18 from which extend emitter, collector and base leads 19, 20, and 21 respectfully. The leads 19, 20, and 21 are formed to have offset portions 22, 23, and 24 respectively. The collector lead 20 terminates in a rectangular mounting platform 25. The leads 19 and 21 have lateral extending portions 26 and 27 respectively which terminate at riser sections 28 and 29. The riser sections 28 and 29 terminate at backward extending sections 30 and 31. The sections 30 and 31 have inwardly extending arms 32 and 33 which are formed to provide spring pressure on the platform 25.

A semiconductor element 34 is placed on the platform 25 and positioned under the arms 32 and 33, see FIG. 3, and the assembly sent through a solder furnace to form a mount assembly. The assembly is then given a coat of varnish and cured to seal. The semiconductor device 34, platform 25 and the portions of the leads 19, 20 and 21 extending into the cavity of 13 of the housing 11 are coated with a thin epoxy layer 36, for example 0.0010 to 0.0015 inches thick, see FIGS. 4 and 5. The epoxy 36 may be any suitable epoxy having good thermal conductivity yet providing electrical insulation, for example, an epoxy sold under the trade name of "Delta Coate." After spraying the epoxy 36, on all sides of the assembly as set forth above, the assembly is then again cured.

The cavity 13 of the housing 11 is filled with an epoxy filler 37, such for example as sold under the trade name of "Delta Bond" filler or other epoxy fillers having good thermal characteristics. The lead frame 17, as assembled, is then inserted in the cavity 13 of the housing 11, see FIGS. 5 and 6. An internal rib 38 in the cavity 13 of the housing 11 coacts with the platform 25 to force the platform into intimate contact with the bottom of the housing 11. The platform 25 is proportioned to have a section 39 extending beyond the element 34 for contacting the rib 38 without damaging the element 34. After curing the tab 18 is then broken off. To facilitate the removal of the tab 18, the leads 19, 20 and 21 have notches 40 thus eliminating the need for a cutting fixture.

The formed contact 17, which is a one piece stamping, provides the mounting surface onto which the semiconductor device 34 is mounted and also has as integral parts the collector, emitter and base leads 20, 19 and 21. The collector lead is a extension of the mounting platform 25. The emitter and base leads 19 and 21 are formed in a manner to provide spring contact with the semiconductor element at assembly. This spring contact feature eliminates the necessity for any positioning fixtures for the formed contact and element assembly during subsequent soldering operation.

The housing 11 serves as a carrier for the formed contact and element assembly and provides means for mounting the unit to a chassis or other surfaces. Also it provides means for pushing the assembly down upon the lower surface of the cavity 13. This feature is the internal rib 38 which is shaped to push the assembly downward as it is inserted in the cavity. By having the assembly positioned as close to the bottom of the cavity, a low thermal resistance rating is obtained. As the housing is isolated electrically from the semiconductor element, it may be mounted directly on a chassis without requiring isolators or mounting kits.

Although only one embodiment of the invention has been illustrated and described, various changes in the form and relative arrangement of the parts, which will now appear to those skilled in the art, may be made without departing from the scope of the invention.

I claim:

1. A semiconductor device assembly comprising a housing having a cavity substantially filled with epoxy, a lead frame assembly having a tab from which extend emitter, collector and base leads respectively, said collector lead terminating at one end in a mounting platform, a semiconductor element seated on said mounting platform and fixedly retained thereto by means of clamping spring pressure exerted on opposite sides of said semiconductor element by said emitter and base leads and by a said mounting platform respectively, and a relatively thin coating of epoxy overlying said mounting platform, said mounting platform and said semiconductor element being positioned in said housing cavity and being intimately surrounded by said epoxy filler.

2. The combination as set forth in claim 1 in which said semiconductor element is secured to said platform and said emitter and base leads by solder forming electrical contacts therewith.

3. The combination as set forth in claim 2 and including means for removing said tab after said semiconductor element is secured to said platform and said emitter and base leads.

4. The combination as set forth in claim 2 in which said platform is positioned adjacent to one side of said housing.

5. The combination as set forth in claim 4 in which said housing includes means for positioning said platform to one side of said housing.

6. The combination as set forth in claim 1 in which said epoxy has good thermal conductivity yet providing electrical insulation.

7. The combination as set forth in claim 1 in which said housing is an alloy casting.

8. The combination as set forth in claim 1 in which said housing includes a mounting section.

9. The combination as set forth in claim 1 in which said emitter, collector and base leads are in parallel spaced relationship.